United States Patent
Kato

(10) Patent No.: US 11,019,760 B2
(45) Date of Patent: May 25, 2021

(54) FEEDER MANAGEMENT METHOD AND FEEDER MANAGEMENT DEVICE

(71) Applicant: FUJI CORPORATION, Chiryu (JP)

(72) Inventor: Daisuke Kato, Kuwana (JP)

(73) Assignee: FUJI CORPORATION, Chiryu (JP)

( * ) Notice: Subject to any disclaimer, the term of this patent is extended or adjusted under 35 U.S.C. 154(b) by 239 days.

(21) Appl. No.: 16/308,698

(22) PCT Filed: Jun. 13, 2016

(86) PCT No.: PCT/JP2016/067493
§ 371 (c)(1),
(2) Date: Dec. 10, 2018

(87) PCT Pub. No.: WO2017/216832
PCT Pub. Date: Dec. 21, 2017

(65) Prior Publication Data
US 2019/0150335 A1   May 16, 2019

(51) Int. Cl.
*H05K 13/04* (2006.01)
*H05K 13/02* (2006.01)
(Continued)

(52) U.S. Cl.
CPC ..... *H05K 13/0419* (2018.08); *H05K 13/0061* (2013.01); *H05K 13/02* (2013.01); *H05K 13/0409* (2018.08); *H05K 13/087* (2018.08)

(58) Field of Classification Search
CPC .......... H05K 3/32; H05K 13/02; H05K 13/04; H05K 13/0404; H05K 13/00419;
(Continued)

(56) References Cited

U.S. PATENT DOCUMENTS 5,321,620 A * 6/1994 Tanaka ............. G05B 19/41865
700/104
5,822,210 A * 10/1998 Kobayashi ........... H05K 13/086
700/121
(Continued)

FOREIGN PATENT DOCUMENTS

CN          1878460 B  *  7/2010
JP          6069696 A  *  3/1994
(Continued)

OTHER PUBLICATIONS

International Search Report dated Jul. 19, 2016 in PCT/JP2016/067493 filed Jun. 13, 2016.

*Primary Examiner* — Carl J Arbes
(74) *Attorney, Agent, or Firm* — Oblon, McClelland, Maier & Neustadt, L.L.P.

(57) ABSTRACT

A feeder management device and method for managing feeders when producing a board based on a production plan including a board conveyance device; a component supply device in which multiple feeders are detachably mounted at multiple installation positions; and an electronic component mounter including a component transfer device. The method including a current state memory step of linking and storing a current component type of the electronic components, being supplied by the currently mounted feeder, and a position of the mounted feeder; a plan memory step of linking and storing required component types of the electronic components, being mounted on the multiple types of boards, and a position of the feeder of supplying the required components; and a reel removal guide step to remove a first reel from a first feeder of supplying the electronic components of which current state component type does not match the required component types.

8 Claims, 6 Drawing Sheets

(51) Int. Cl.
*H05K 13/00* (2006.01)
*H05K 13/08* (2006.01)

(58) Field of Classification Search
CPC ............... H05K 13/08; H05K 13/0812; H05K 13/0061; H05K 13/0409; H05K 13/0419; H05K 13/087
See application file for complete search history.

(56) References Cited

U.S. PATENT DOCUMENTS

| | | | | |
|---|---|---|---|---|
| 6,788,989 B2 * | 9/2004 | Kodama | ............ | H05K 13/0882 700/117 |
| 7,251,541 B2 * | 7/2007 | Shimizu | ............ | H05K 13/0882 700/121 |
| 7,738,985 B2 * | 6/2010 | Awata | ............ | H05K 13/0452 700/103 |
| 7,801,634 B2 * | 9/2010 | Kurata | ............ | H05K 13/0885 700/108 |
| 9,811,078 B2 * | 11/2017 | Sagara | ............ | G05B 19/41865 |
| 10,015,919 B2 * | 7/2018 | Takata | ............ | H05K 13/0419 |

FOREIGN PATENT DOCUMENTS

| | | | |
|---|---|---|---|
| JP | 06291500 A | * | 10/1994 |
| JP | 2532756 B2 | * | 9/1996 |
| JP | 10-200290 A | | 7/1998 |
| JP | 2000-261191 A | | 9/2000 |
| JP | 2001-127487 A | | 5/2001 |
| JP | 2001127487 A | * | 5/2001 |
| JP | 2002261490 A | * | 9/2002 |
| JP | 2005-175017 A | | 6/2005 |
| JP | 2005175017 A | * | 6/2005 |
| JP | 2005-216965 A | | 8/2005 |
| JP | 4014613 B2 | * | 11/2007 |
| JP | 4070799 B2 | * | 1/2008 |
| JP | 2009-246406 A | * | 10/2009 |
| JP | 4491507 B2 | * | 6/2010 |
| JP | 2011-199217 A | | 10/2011 |
| JP | 2011199217 A | * | 10/2011 |

* cited by examiner

FIG.5

| PRODUCTION PLAN | PRODUCTION ORDER | FIRST | SECOND | THIRD | FOURTH |
|---|---|---|---|---|---|
| | BOARD TYPE | B1 | B2 | B3 | B4 |
| SLOT POSITION (INSTALLATION POSITION) | SL1 | F1 (P1) | UNUSED | UNUSED | UNUSED |
| | SL2 | F2 (P2) | F2 (P2) | F2 (P2) | F2 (P2) |
| | SL3 | F3 (P3) | F6 (P6) | F4 (P4) | F3 (P3) |
| | SL4 | F4 (P4) | F7 (P7) | F8 (P8) | F7 (P7) |
| | SL5 | F5 (P5) | UNUSED {INSTALL F5} | F5 (P5) | UNUSED |

FIG.6
NEXT BOARD TYPE TO BE PRODUCED: B2

|  |  | GUIDE CONTENTS |
|---|---|---|
| SLOT POSITION (INSTALLATION POSITION) | SL1 | REMOVE REEL FROM FEEDER F1 (→ REMOVE FEEDER F1) |
|  | SL2 | MAINTAIN CURRENT STATE OF FEEDER F2 |
|  | SL3 | REMOVE FEEDER F3 WITH REEL AND RE-INSTALL REEL IN THIRD SLOT SL3 IN FOURTH SPOT IN PRODUCTION ORDER |
|  | SL4 | REMOVE FEEDER F4 WITH REEL AND RE-INSTALL REEL IN THIRD SLOT SL3 IN THIRD SPOT IN PRODUCTION ORDER |
|  | SL5 | MAINTAIN CURRENT STATE OF FEEDER F5 |

FIG.7
NEXT BOARD TYPE TO BE PRODUCED: B3

|  |  | GUIDE CONTENTS |
|---|---|---|
| SLOT POSITION (INSTALLATION POSITION) | SL1 | UNUSED. |
|  | SL2 | MAINTAIN CURRENT STATE OF FEEDER F2 |
|  | SL3 | REMOVE REEL FROM FEEDER F6 (→ REMOVE FEEDER F6) |
|  | SL4 | REMOVE FEEDER F7 WITH REEL AND RE-INSTALL REEL IN FOURTH SLOT SL4 IN FOURTH SPOT IN PRODUCTION ORDER |
|  | SL5 | MAINTAIN CURRENT STATE OF FEEDER F5 |

FEEDER MANAGEMENT METHOD AND FEEDER MANAGEMENT DEVICE

TECHNICAL FIELD

The present application relates to a feeder management method and a feeder management device when a board is produced based on a production plan defining a production order of multiple types of boards by using an electronic component mounter.

BACKGROUND ART

Equipment for producing a board on which a large number of electronic components are mounted includes a solder printing machine, an electronic component mounter, a reflow machine, and a board inspection machine. It is common to configure a board production line by connecting these board production devices. Among them, an electronic component mounter includes a board conveyance device, a component supply device, a component transfer device, and a control device. As a typical example of a component supply device, a configuration is known in which multiple feeders for feeding out carrier tape are detachably arranged in a row, the carrier tape holding multiple electronic components.

In response to diversification of consumer needs in recent years, the trend of low-volume production of multiple types of boards has progressed, and there are cases in which boards are produced according to a production plan that specifies a production order for multiple types of boards. In this case, when the type of board is changed, setup changing work for changing the type of electronic component supplied by the component supply device is performed. As a method of changing the component type, there is a first method of replacing the reel on which a carrier tape is wound and a second method of replacing the feeders themselves. In the second method, the next target reel is held in advance by a replacement feeder, and the replacement feeder is provided with the next reel by setup changing work. In general, the correspondence relationship between the reels and the feeders is often managed with linking of ID codes assigned to the reels and the feeders. Examples of techniques relating to this type of feeder management method are disclosed in patent literature 1 and patent literature 2.

A chip component supply device of patent literature 1 includes a reel holding section for holding a reel on which a carrier tape is wound in a freely replaceable manner, a rod-shaped member for holding the reel holding section at one end, a reel feeding section, being disposed at the other end of the rod-shaped member, for feeding the carrier tape, a reel guide section for taking in the carrier tape to separate the carrier tape into a component storage tape and a top cover tape, and a take-up reel for winding up the top cover tape. According to the description of the embodiment, when the tape is replaced, the reel is reverse-rotated to rewind the used tape along with the top cover tape and the reel guide section is moved outside of the electronic component mounter to perform exchange work. As a result, even in a situation in which the reels are frequently used and replaced, the exchange work can be performed more efficiently, by which the work can be performed more quickly, and costs can be reduced.

The feeder management method of patent literature 2 includes a step of determining whether a current component type of the component used for a board type currently being produced is also used for the next and subsequent board types, and a step of guiding a handling operation of a feeder based on the determination result, thus a feeder management device executes the two steps during the period of performing the current production job. Further, a guiding step guides and indicates that a feeder is maintained in a current attachment slot when the current component type is used for the next board type; the feeder is stored in an empty slot or a shelf for the current mounter when the current component type is used for the board after the next board and subsequent board type; the feeder is stored in a shelf for a different mounter when the current component type is used for a different electronic component mounter, and the feeder is stored on a warehouse shelf when the current component type is not used thereafter. As a result, it is possible to reduce the workload required for an operator to confirm the content of setup changing work, and it is possible to quickly commence work.

PATENT LITERATURES

Patent literature 1: Japanese Patent Application Laid-Open No. 2000-261191;
Patent literature 2: Japanese Patent Application Laid-Open No. 2011-199217

BRIEF SUMMARY

Technical Problem

The feeder management method of patent literature 2 is a technique for determining a necessity of removing a feeder at a time of setup changing work and, in addition, guiding the removed feeder to a storage location. As the trend of multi-type small-volume production progresses, the number of electronic component types increases, so that the capacity of feeders on hand may exceed significantly with causing setup changing work to occur frequently. As a result, the frequency of reel exchange work exemplified by patent literature 1 increases. However, since patent literature 2 does not disclose any description of reel exchange work, which makes it difficult for an operator to determine whether to remove a reel from a feeder. Conventionally, in order to accurately make this determination, a troublesome effort was required for examining a production plan to confirm whether an electronic component was scheduled to be used.

It is also common to optimize the predetermined order of feeders on the component supply device for each board type, that is, the predetermined order of component types is optimized by using an optimization technique for the mounting operation. In these situations, even if a feeder is to continue being used, the position of the mounting slot may change. Further, when in a rest period for a certain type of board for which the feeder is not used but used before and after the rest period, it is difficult to determine whether the feeder should be allowed to continue occupying a mounting slot through the rest period. Considering such a mode of use of the feeder, the guide step of patent literature 2 is not always adequate and sufficient.

The present disclosure has been made in view of the above-mentioned circumstances of the background art, and it is an object of the present disclosure to provide a feeder management method and a feeder management device, having improved efficiency, which appropriately guides a determination of whether to remove a reel based on a production plan at a time of setup changing work that accompanies a change in the type of target board to be produced.

Solution to Problem

A feeder management method accord to the present disclosure for solving the above-mentioned circumstances is a feeder management method configured to manage a feeder when producing a board based on a production plan specifying a production order of multiple types of boards in a predetermined future period by using: a board conveyance device configured to carry in/out and determine a position of a board; a component supply device in which multiple feeders are detachably mounted at multiple installation positions, the feeder interchangeably holding a reel onto which a carrier tape with holding electronic components is wound, and an electronic component mounter including a component transfer device configured to pick up the electronic components from the feeder and mounting the electronic components on a board having a predetermined position; wherein the feeder management method comprises: a current state memory step of linking and storing a current component type of the electronic components, being supplied by the currently mounted feeder, and an installation position of the mounted feeder; a plan memory step of linking and storing required component types of the electronic components, being mounted on the multiple types of boards, and an installation position of the feeder of supplying the required components, and a reel removal guide step of guiding to remove a first reel from a first feeder of supplying the electronic components of which current state component type does not match any of the required component types.

A feeder management method according to the present disclosure is a feeder management method configured to manage a feeder when producing a board based on a production plan specifying a production order of multiple types of boards in a predetermined future period by using: a board conveyance device configured to carry in/out and determine a position of a board; a component supply device in which multiple feeders are detachably mounted at multiple installation positions, the feeder interchangeably holding a reel onto which a carrier tape with holding electronic components is wound, and an electronic component mounter including a component transfer device configured to pick up the electronic components from the feeder and mounting the electronic components on a board having a predetermined position; wherein the feeder management method comprises: a current state memory step of linking and storing a current component type of the electronic components, being supplied by the currently mounted feeder, and an installation position of the mounted feeder; a plan memory step of linking and storing required component types of the electronic components, being mounted on the multiple types of boards, and an installation position of the feeder of supplying the required components, and a current state maintenance guide step of guiding maintenance of the current state of a first feeder when there is the current component type corresponding to the required component type and removal of the first feeder is unnecessary, and a re-installation guide step of guiding removal of a first feeder in a state where a reel is held. and guiding re-installation when there is the current component type corresponding to the required component type and removal of the first feeder is necessary.

Further, a feeder management device according to the present disclosure is a feeder management device configured to manage a feeder when producing a board based on a production plan specifying a production order of multiple types of boards in a predetermined future period by using: a board conveyance device configured to carry in/out and determine a position of a board; a component supply device in which multiple feeders are detachably mounted at multiple installation positions, the feeder interchangeably holding a reel onto which a carrier tape with holding electronic components is wound; an electronic component mounter including a component transfer device configured to pick up the electronic components from the feeder and mounting the electronic components on a board having a predetermined position; a current state memory section configured to link and store a current component type of the electronic components, being supplied by the currently mounted feeder, and an installation position of the mounted feeder; a plan memory section configured to link and store a required component type of the electronic components, being mounted on the multiple types of boards, and an installation position of the feeder of supplying the required components, and a reel removal guide section configured to guide to remove a first reel from a first feeder of supplying the electronic components of which current state component type does not match any of the required component types.

A feeder management device according to the present disclosure is A feeder management device configured to manage a feeder when producing a board based on a production plan specifying a production order of multiple types of boards in a predetermined future period by using: a board conveyance device configured to carry in/out and determine a position of a board; a component supply device in which multiple feeders are detachably mounted at multiple installation positions, the feeder interchangeably holding a reel onto which a carrier tape with holding electronic components is wound; an electronic component mounter including a component transfer device configured to pick up the electronic components from the feeder and mounting the electronic components on a board having a predetermined position; a current state memory section configured to link and store a current component type of the electronic components, being supplied by the currently mounted feeder, and an installation position of the mounted feeder; a plan memory section configured to link and store a required component type of the electronic components, being mounted on the multiple types of boards, and an installation position of the feeder of supplying the required components; a current state maintenance guide section configured to guide maintenance of the current state of a first feeder when there is the current component type corresponding to the required component type and removal of the first feeder is unnecessary, and a re-installation guide section configured to guide removal of a first feeder in a state where a reel is held. and guiding re-installation when there is the current component type corresponding to the required component type and removal of the first feeder is necessary.

With the feeder management method according to the present disclosure a current state component type of being not scheduled to be used, can be automatically distinguished by storing and comparing a current state component type of electronic component suppliable in the current state, and a request component type of electronic component to be required for a production plan. Prior to setup changing work at the time of changing the type of board to be produced, guiding removal of a first reel from a first feeder, for supplying an electronic component of the current state component type which is not scheduled to be used, is performed. In this way, the operator can remove the first reel from the first feeder without difficulty. This eliminates the need for troublesome effort of confirming whether the reel is to be removed by checking whether the electronic component is scheduled to be used, thereby improving the work efficiency.

With the feeder management method according to the present disclosure, it is possible to automatically determine the current component type to be used and whether it is necessary to remove the first feeder provided at the first installation position corresponding to the current component type to be used. Then, guiding is performed such that the current state of a feeder is maintained, or the first feeder is removed with holding reel R to be re-installed later. Consequently, an operator can properly perform the handling operation of the first feeder without difficulty, and the reel is not erroneously removed from the first feeder. This eliminates the need to evaluate the content of the handling operation of the feeder by referring to the production plan, thereby improving the operation efficiency.

Further, with the feeder management device according to the present disclosure, similarly to the feeder management method, it is unnecessary to decide whether to remove the reel and work efficiency is improved. According to the feeder management device according to the present disclosure, similarly to the feeder management method, it is unnecessary to evaluate the content of the handling operation of the feeder and work efficiency is improved.

BRIEF DESCRIPTION OF DRAWINGS

FIG. 5 is a table showing information stored in a current state memory step and a plan memory step shown in FIG. 4.

FIG. 6 is a table showing an example of guide contents in a reel removal guide step, a feeder removal guide step, a current state maintenance guide step, and a re-installation guide step.

FIG. 7 is a diagram showing another example of guide contents.

DESCRIPTION OF EMBODIMENT

1. Configuration of Electronic Component Mounter 1

Figure 1:
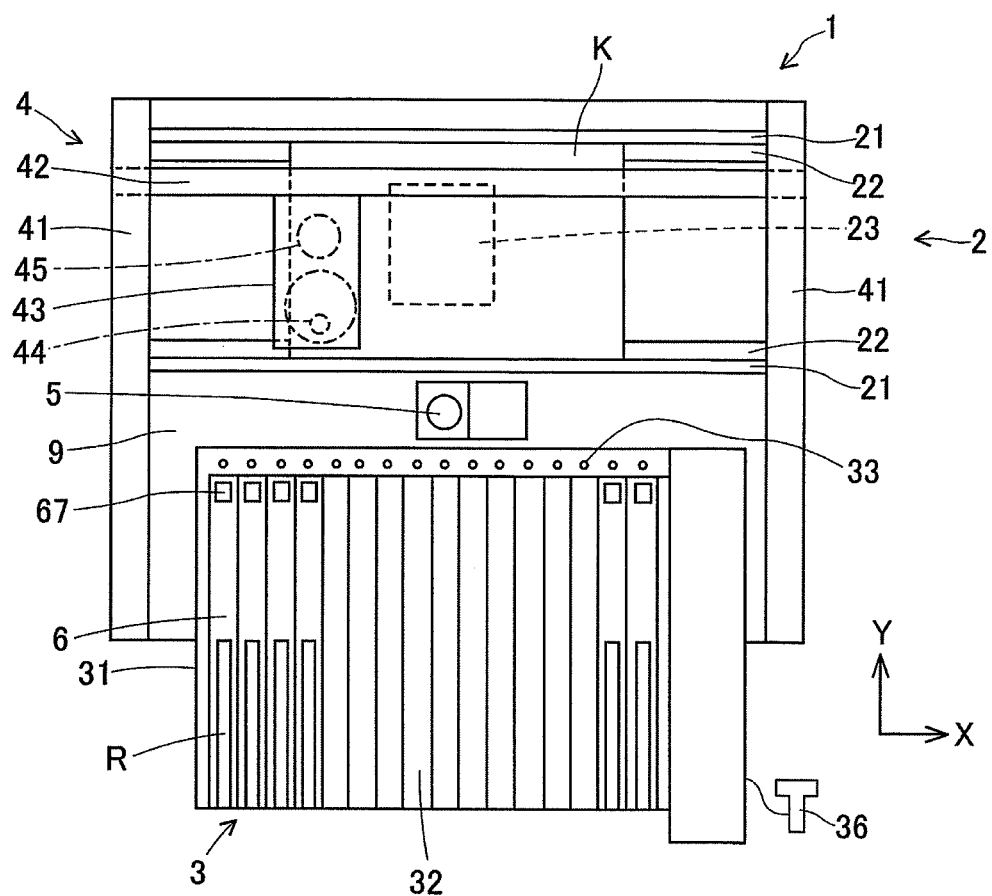
FIG. 1 is a plan view of an electronic component mounter to which the feeder management method and feeder management device of an embodiment are applied.

First, a feeder management method and a configuration of electronic component mounter 1 to which a feeder management device of an embodiment of the present disclosure is applied will be described. FIG. 1 is a plan view of electronic component mounter 1 to which the feeder management method and feeder management device of the embodiment are applied. The left-right direction of the sheet surface of FIG. 1 is the X-direction for conveying board K, and the vertical direction of the sheet surface is the Y-direction. As shown, electronic component mounter 1 includes board conveyance device 2, component supply device 3, and component transfer device 4.

Board conveyance device 2 is disposed on the upper face of machine base 9, and transports board K in the X-direction to be positioned at the mounting position. Board conveyance device 2 includes a pair of guide rails 21, a pair of conveyor belts 22, clamping device 23, and the like. The pair of guide rails 21 extend in the X-direction and are arranged in parallel with each other. The pair of conveyor belts 22 has an annular shape on which board K can be placed and is rotatably provided on opposite inner sides of guide rails 21. The clamping device 23 is disposed below the mounting position set around the center in the X direction between the pair of guide rails 21. Board K is conveyed in and out by conveyor belt 22 while being guided by guide rails 21 and is positioned and fixed in the mounting position by clamping device 23.

Component supply device 3 is configured with substantially rectangular pallet member 31 as a main member. Multiple slots 32 extending in the Y-direction and aligned in the X-direction are formed on the upper surface of pallet member 31. The slot position at which slot 32 is formed corresponds to an installation position at which feeder 6 is provided. Display section 33 corresponding to each slot 32 is provided on the front upper portion of pallet member 31. An LED lamp can be used as display section 33, but the present disclosure is not limited thereto. In component supply device 3, multiple feeders 6 are detachably mounted in multiple slots 32, respectively. Component supply device 3 includes display section 33 and component supply control section 35 (shown in FIG. 3) for controlling feeder 6 provided with display section 33.

Feeder 6 interchangeably holds reel R in the rear and has component supply position 67 on the front upper portion, which will be described in detail later. In the example of FIG. 1, pallet member 31 is provided with 16 slots 32 and display section 33. Feeder 6 is provided in each slot 32 at a total of six places (two places near the right edge and four places near the left edge) of pallet member 31.

Component transfer device 4 includes a pair of fixed rails 41, head moving rail 42, mounting header 43, suction nozzle 44, and the like. The pair of fixed rails 41 extend above board conveyance device 2 in the Y-direction and are arranged in parallel with each other. Head moving rail 42 extends in the X-direction, and both ends thereof are movably supported by fixed rail 41. Head moving rail 42 is driven in the Y-direction by a ball screw feed mechanism (not shown). Mounting head 43 is movably supported by head moving rail 42. Mounting head 43 is driven in the X-direction by a ball screw feed mechanism (not shown). Mounting head 43 has suction nozzle 44 and board identifying camera 45 facing downward. Suction nozzle 44 collects an electronic component by picking up the electronic component from feeder 6, and mounts the electronic component on positioned board K. Board identifying camera 45 accurately identifies the coordinate position of positioned board K.

Component identifying camera 5 is disposed between board conveyance device 2 and component supply device 3. Component identifying camera 5 identifies the pickup state of the electronic component collected by suction nozzle 44 from below.

Figure 2:
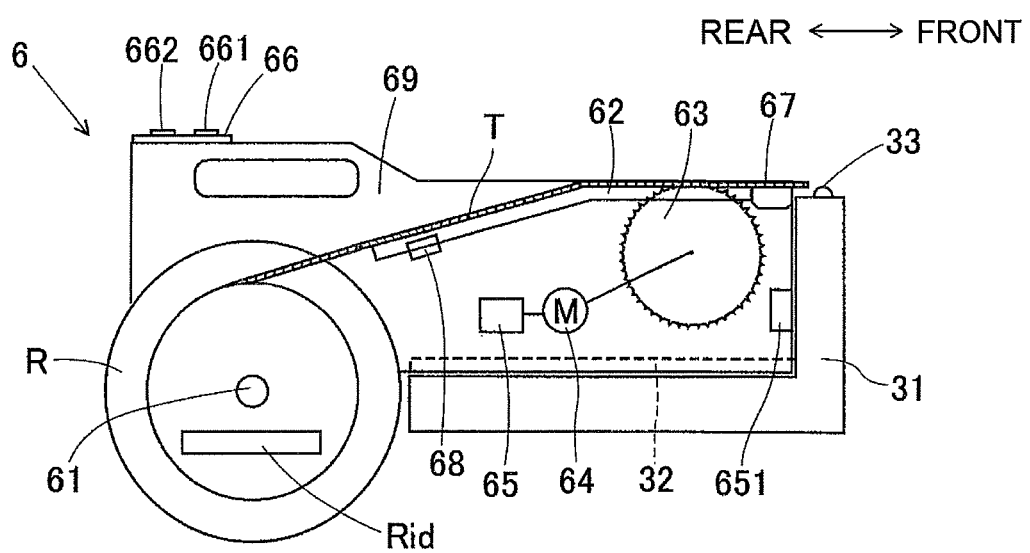
FIG. 2 is a side view schematically illustrating a configuration example of a feeder.

FIG. 2 is a side view schematically illustrating a configuration example of feeder 6. Feeder 6 includes reel holding shaft 61, tape guide member 62, sprocket 63, driving motor 64, feeder control section 65, operation panel 66, tape detection sensor 68, and the like, which are attached to side plate 69. Reel holding shaft 61 is provided on the lower side in the rear of side plate 69. Reel holding shaft 61 holds reel R in an exchangeable manner, with carrier tape T, holding electronic components, being wound on reel R. In the present embodiment, it is assumed that reel R of reel holding shaft 61 can be replaced in a state in which feeder 6 is installed in slot 32. The present disclosure is not limited to this, and the structure may be such that feeder 6 is removed from slot 32 and reel R of reel holding shaft 61 is replaced.

Figure 3:
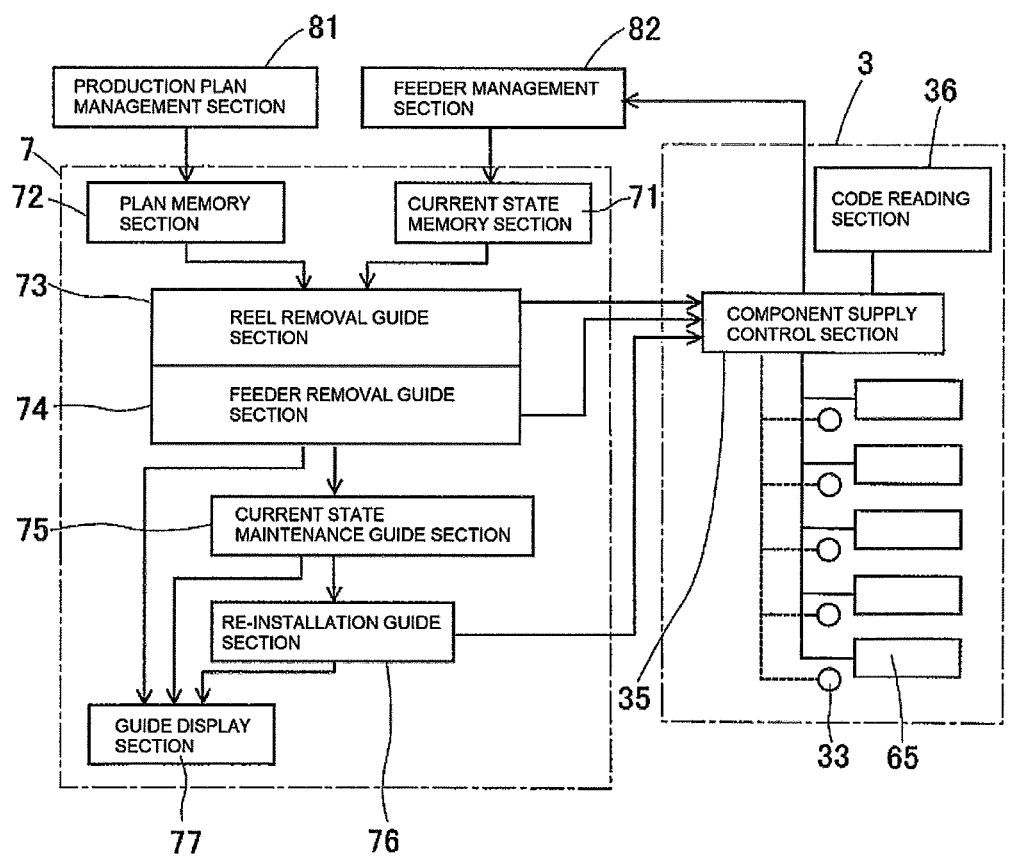
FIG. 3 is a functional block diagram illustrating a feeder management device of the embodiment.

Reel ID code Rid attached to each individual reel R is read by code reading section 36 of component supply device 3 shown in FIGS. 1 and 3, and identified by component supply control section 35. A barcode can be used as reel ID code Rid, and a barcode reader can be used as code reading section 36. By reel ID code Rid, the component type of electronic component supplied from carrier tape T wound onto reel R is known.

Tape guide member 62 extends inclined forward and upward from the front of held reel R, and extends horizontally forward after reaching the upper edge of side plate 69. Tape guide member 62 guides carrier tape T fed out from reel R to the upper front portion of component supply position 67. Sprocket 63 is pivotally supported below tape guide member 62, toward the front. The teeth of the outer periphery of sprocket 63 engage with the sprocket holes of carrier tape T. Drive motor 64 can rotationally drive sprocket 63 in both the normal rotation direction and the reverse rotation direction. Drive motor 64 is controlled by feeder control section 65.

Feeder control section 65 is a computer control device having a CPU and operated by software. Feeder control section 65 stores a feeder ID code set for each individual feeder 6. Feeder control section 65 is connected in communication with component supply control section 35 via a connector 651 provided on the front surface. Sprocket 63, drive motor 64, and feeder control section 65 constitute a tape feeding mechanism of the present disclosure.

Operation panel 66 is provided on the upper face near the rear of side plate 69. Operation panel 66 has feed switch 661 and rewind switch 662. Feed switch 661 and rewind switch 662 are manual switches operated by an operator, and the operating state thereof is transmitted to feeder control section 65. When feed switch 661 or rewind switch 662 is pushed, sprocket 63 of the tape feeding mechanism is intermittently driven to rotate forward or reverse. As a result, carrier tape T is fed or rewound by a small amount.

During normal operation, the function of operation panel 66 is regulated, and the tape feeding mechanism feeds out carrier tape T by pitch feeding and sequentially feeds electronic components to component feeding position 47. On the other hand, the function of operation panel 66 is used in setup changing work when changing the type of board K produced by electronic component mounter 1. That is, the operator sets reel R on reel holding shaft 61, inserts the leading end of the carrier tape T into sprocket 63, and then presses feed switch 661. As a result, the tape feeding mechanism feeds out carrier tape T by small amounts.

On the other hand, two types of operation modes can be selected for removing reel R. The first operation mode is an automatic rewind mode in which the function of operation panel 66 is not used. In the automatic rewind mode, the tape feeding mechanism automatically rewinds carrier tape T to reel R. The second operation mode is a manual rewind mode in which the function of operation panel 66 is used. In the manual rewind mode, when rewind switch 662 is pressed long, the tape feeding mechanism is allowed to continuously rewind carrier tape T to reel R. This facilitates the operation of removing reel R.

The automatic rewind mode is selected in an automatic rewind step to be described later and the manual rewind mode is selected in a manual rewind step to be described later. Depending on the model of feeder 6, only one of the automatic rewind mode and the manual rewind mode may be provided in a fixed manner.

Tape detection sensor 68 is disposed at an inclined section near the rear of tape guide member 62. Tape detection sensor 68 detects the presence or absence of carrier tape T to be fed out, and sends the detection result to feeder control section 65. Even if carrier tape T is rewound by the tape feeding mechanism at the time of exchange work for reel R, the leading end of carrier tape T is returned only to sprocket 63. Thereafter, when the operator rewinds the leading end of carrier tape T to reel R, the detection result of tape detection sensor 68 changes from "tape present" to "tape absent". Based on the change in the detection result, feeder control section 65 determines that reel R has been removed.

2. Configuration of Feeder Management Device 7 of the Embodiment

Descriptions are moved on the feeder management device and the feeder management method of the embodiment. Electronic component mounter 1 described above constitutes a board production line together with other board production equipment. A host computer is used to manage the operating conditions of the board production line. Feeder management device 7 of the embodiment is controlled by software of the host computer. The feeder management method of the embodiment is implemented by feeder management device 7. FIG. 3 is a functional block diagram showing the feeder management device 7 of the embodiment. In FIG. 3, component supply device 3 of electronic component mounter 1 is simplified and feeder 6 is provided in each of five slots 32, that is, the first to fifth slots SL1 to SL5.

The host computer has production plan management section 81 and feeder management section 82 as functions in addition to feeder management device 7. Production plan management section 81 manages a production plan that specifies a production order of multiple types of boards K for a predetermined future period. Production plan management section 81 updates the sequential production plan based on the progress of production and addition of an order for a new type of board K. The production plan includes information such as a required component type of electronic component mounted on multiple types of boards K and a slot position (any one of the first to fifth slots SL1 to SL5) of feeder 6 for supplying the required component type of electronic component.

On the other hand, component supply control section 35 of component supply device 3 obtains the feeder ID code of equipped feeder 6 from each feeder control section 65 by communication. As a result, component supply control section 35 can link and store the feeder ID code of each feeder 6 and corresponding slot position. Next, component supply control section 35 focuses on reel R set in each feeder 6 in order and obtain attached reel ID code Rid using code reading section 36. As a result, component supply control section 35 performs a code linking step of linking and storing a feeder ID code to identify the feeder and a reel ID code Rid to identify the reel. In feeder 6 that holds a reel R, being in use, in advance, the code linking step has already been performed at the time feeder 6 holds reel R, thereby it is not necessary to repeat the code linking step. Component supply control section 35 can link and store the current component type of electronic component supplied by feeder 6 currently installed and the slot position of installed feeder 6.

Information, linking the feeder ID code with reel ID code Rid, and information, linking the current component type of electronic component with the slot position of feeder 6, are delivered from component supply control section 35 to feeder management section 82. Feeder management section 82 collectively manages not only information delivered from component supply control section 35 but also information from other component supply control sections and information delivered in the past. That is, feeder management section 82 also manages feeder 6 used in other electronic component mounters and feeders 6 that are temporarily removed.

The host computer has, as functions of feeder management device 7, current state memory section 71, plan memory section 72, reel removal guide section 73, feeder removal guide section 74, current state maintenance guide section 75, re-installation guide section 76, and guide display section 77. Guide display section 77 is hardware such as a display device for displaying guide contents to an operator. Each section 71 to 76, other than guide display section 77, is implemented using software. The functions of respective sections 71 to 76, other than guide display section 77, are shown in the feeder management method of the embodiment described below.

3. Feeder Management Method of the Embodiment

Figure 4:
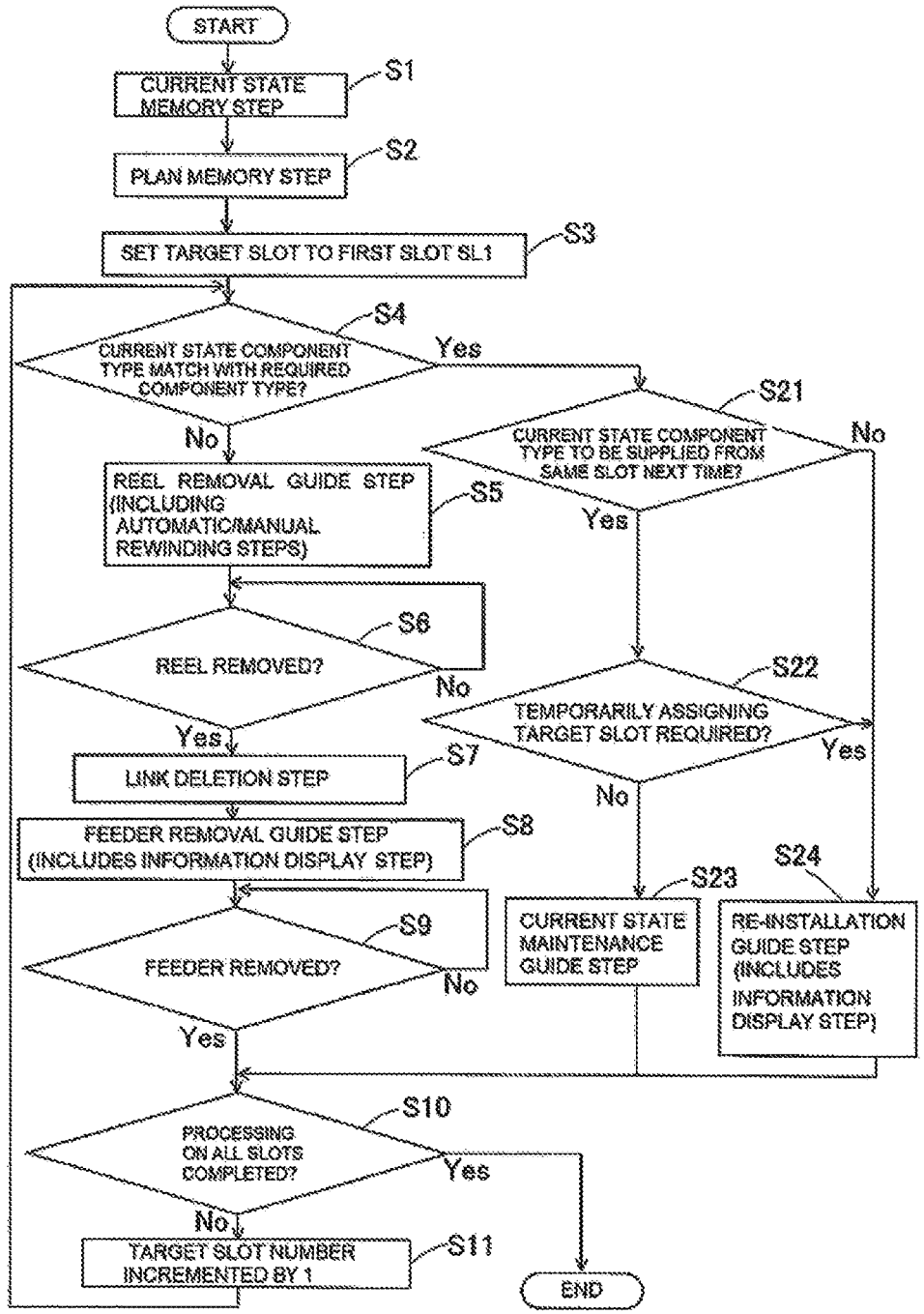
FIG. 4 is a flowchart showing a feeder management method of the embodiment.

FIG. 4 is a flowchart showing a feeder management method of the embodiment. This process flow is executed for the benefit of setup changing work when production of board K of a certain board type is completed and shifts to a next board type. In current state memory step S1 of FIG. 4, current state memory section 71 links and stores the current component type of electronic component to be supplied by feeder 6 installed in the current state and the slot position of feeder 6 installed in the current state. Current state memory section 71 obtains required information from feeder management section 82. In the next plan memory step S2, plan memory section 72 links and stores a required component type of electronic component mounted on multiple types of boards K and the slot position of feeder 6 for supplying the required component type of electronic component. Plan memory section 72 obtains required information from production plan management section 81.

FIG. 5 is a diagram of a list exemplifying information stored in current state memory step S1 and plan memory step S2 shown in FIG. 4. In the figure, F1 to F8 denote individual feeders 6, and P1 to P8, in parentheses, denote different component types of electronic components. In this example, the order of production of boards K is simplified from a first to a fourth spot, and the types of boards K to be produced are four board types B1 to B4. Further, slots 32 are simplified to five places (i.e., first to fifth slots SL1 to SL5), and the component types of electronic components mounted on board K of one board type are simplified to five or fewer types. It is assumed that the production of board K of board type B1 of the first spot in the production order shown in FIG. 5 is completed.

In the first spot in the production order shown in the figure, feeder F1 is provided in first slot SL1, and electronic components of component type P1 are supplied from feeder F1. Similarly, feeder F2 is provided in second slot SL2, and electronic components of component type P2 are supplied from feeder F2. Further, feeders F3 to F5 were installed in third to fifth slots SL3 to SL5, and electronic components of component types P3 to P5 were supplied from feeders F3 to F5. The feeder ID codes of feeders F1 to F5 and reel ID codes Rid of reels R for supplying electronic components of component types P1 to P5 are linked in advance by the code linking step described above.

Therefore, current state memory section 71 links and stores current component type P1 and first slot SL1. Similarly, current state memory section 71 links and stores current component type P2 and second slot SL2, and further links and stores current component types P3 to P5 and third to fifth slots SL3 to SL5.

In the second spot in the production order, first slot SL1 and fifth slot SL5 are planned to be unused. Feeder F2 is provided in second slot SL2, and electronic components of component type P2 are to be supplied from feeder F2. Similarly, feeders F6 and F7 are provided in third and fourth slots SL3 and SL4, and electronic components of component types P6 and P7 are to be supplied from feeders F6 and F7.

Therefore, plan memory section 72 links and stores required component type P2 and second slot SL2. Similarly, plan memory section 72 links and stores required component type P6 and third slot SL3 and further links and stores required component type P7 and fourth slot SL4.

Similarly, in the third spot in the production order, first slot SL1 is planned to be unused. Plan memory section 72 links and stores required component type P2 and second slot SL2, and links and stores required component type P4 and third slot SL3. Further, plan memory section 72 links and stores required component type P8 and fourth slot SL4, and links and stores required component type P5 and fifth slot SL5.

Similarly, in the fourth spot in the production order, first slot SL1 and fifth slot SL5 are scheduled to be unused. Plan memory section 72 links and stores required component type P2 and second slot SL2, and links and stores required component type P3 and third slot SL3. Further, plan memory section 72 links and stores required component type P7 and fourth slot SL4.

Returning to FIG. 4, in step S3, feeder management device 7 sets the target slot to first slot SL1. In the next step S4, feeder management device 7 determines whether current component type P1 of first slot SL1 matches any of required component types. Feeder management device 7 determines that current component type P1 does not match any of required component types P2 to P8 and advances the process flow to reel removal guide step S5.

In reel removal guide step S5, reel removal guide section 73 displays a guide for removing the reel from feeder F1 on guide display section 77. FIG. 6 is a table showing an example of guide contents in reel removal guide step S5, feeder removal guide step S8, current state maintenance guide step S23, and re-installation guide step S24. As shown in the figure, at the position of first slot SL1 of guide display section 77, the guide content "Remove reel from feeder F1" is displayed. Therefore, the operator can start the work of removing reel R from feeder F1 without difficulty in setup changing work.

Reel removal guide step S5 also includes an automatic rewind step or a manual rewind step. When the automatic rewind step is included, reel removal guide section 73 selects the automatic rewind mode and instructs feeder F1 via component supply control section 35. As a result, the tape feeding mechanism of feeder F1 automatically rewinds carrier tape T to reel R. When the manual rewind step is included, reel removal guide section 73 selects the manual rewind mode and instructs feeder F1 via component supply control section 35. Thus, in feeder F1, when rewind switch 662 is pressed for a long time, the tape feeding mechanism continuously rewinds carrier tape T to reel R.

In next step S6, reel removal guide section 73 waits for reel R of feeder F1 to be removed. Information that reel R has been detached is delivered from tape detection sensor 68 to reel removal guide section 73 via feeder control section 65, component supply control section 35, and feeder management section 82. When reel R is removed, reel removal guide section 73 advances the process flow to link deletion step S7. In link deletion step S7, the reel removal guide section 73 deletes the link between the feeder ID code of feeder F1 and reel ID code Rid of reel R for supplying the electronic component of component type P1.

In the next feeder removal guide step S8, feeder removal guide section 74 displays a guide for detaching feeder F1 from component supply device 3 on guide display section 77. As shown in FIG. 6, guide contents of the position of first slot SL1 of guide display section 77 is changed to "Remove feeder F1".

Further, feeder removal guide step S8 includes an information display step. That is, feeder removal guide section 74 displays the removal information on display section 33 corresponding to first slot SL1 via component supply control section 35. As a result, for example, an LED lamp serving as display section 33 is turned on. Therefore, the operator can visually recognize removal information of display section 33 in setup changing work and start the operation of removing feeder F1 without difficulty.

In the next step S9, feeder removal guide section 74 waits for feeder F1 to be removed. Information regarding removal of feeder F1 is delivered to feeder removal guide section 74 via component supply control section 35 and feeder management section 82. When feeder F1 is detached, feeder removal guide section 74 deletes the removal information, turns off the LED lamp, for example, and advances the process flow to step S10.

In step S10, feeder management device 7 determines whether processing of all slots has been completed. When in step S10 for the first time, since only processing of the first slot SL1 is completed, the process flow proceeds to step S11. In step S11, feeder management device 7 increments the number of the target slot by 1 to operate on second slot SL2 and returns the process flow to step S4.

In the second step S4, feeder management device 7 identifies that current component type P2 of second slot SL2 matches with required component type P2 of second slot SL2 of the second spot in the production order and advances the process flow to step S21. In step S21, feeder management device 7 determines whether current component type P2 is supplied from the same slot next time. Since current component type P2 is supplied from the same second slot SL2 in the second spot in the production order, the feeder management device 7 advances the process flow to step S22. In step S22, feeder management device 7 determines whether second slot SL2 needs to be assigned temporarily to another required component type. If it is determined that second slot SL2 does not its need, feeder management device 7 advances the process flow to current state maintenance guide step S23.

In current state maintenance guide step S23, current state maintenance guide section 75 causes guide display section 77 to display a guidance for maintaining the current state of feeder F2. As a result, as shown in FIG. 6, the guide content "Maintain current state of feeder F2" is displayed at the position of second slot SL2 of guide display section 77. Therefore, the operator does not have difficulty in setup changing work. When current state maintenance guide step S23 ends, feeder management device 7 merges the process flow into step S10, focuses on third slot SL3 in step S11, and returns the process flow to step S4.

In the third step S4, feeder management device 7 identifies that current component type P3 of third slot SL3 corresponds to required component type P3 of fourth slot SL3 of the production order and proceeds to step S21. In step S21, feeder management device 7 identifies that current component type P3 is supplied from the same third slot SL3 in the fourth spot in the production order next time and advances the process flow to step S22. In step S22, feeder management device 7 determines that the third slot SL3 needs to be temporarily assigned to required component types P6 and P4 in the second and third spots in the production order and advances the process flow to re-installation guide step S24.

In re-installation guide step S24, re-installation guide section 76 removes feeder F3 with holding the reel, and guide display 77 displays a guidance for later re-installment. As a result, as shown in FIG. 6, at the position of third slot SL3 of guide display section 77, the guide content "Remove feeder F3 with holding reel and re-install reel in third slot SL3 in fourth spot in production order" is displayed. Further, re-installation guide step S24 includes an information display step and displays removal information on display section 33 corresponding to third slot SL3. Accordingly, the operator can remove feeder F3 and re-install feeder F3 in the fourth spot in the production order without difficulty during setup changing operation. When re-installation guide step S24 ends, feeder management device 7 merges the process flow into step S10, focuses on fourth slot SL4 in step S11, and returns the process flow to step S4.

In the fourth step S4, feeder management device 7 identifies that current component type P4 of fourth slot SL4 corresponds to required component type P4 of third slot SL3 in the third spot in the production order and proceeds to step S21. As described above, even if component type P4 is the same, the component may be supplied from different slot positions when the type of board is changed. For example, a mounting operation optimization technique may be used to optimize the predetermined order of feeders 6 on component supply device 3 for each type of board K, that is, the predetermined order of the component types. In this case, third slot SL3 at the center in the width direction of component supply device 3 is closest to board K and component identifying camera 5 and the mounting operation is performed in a short time. On the other hand, as the slot of the widthwise end of component supply device 3 is approached, a long time is required for the mounting operation. Therefore, when a large number of required component types P4 are mounted on board type B3 in the third spot in the production order, the supply position of component type P4 is changed from fourth slot SL4 to third slot SL3, and the mounting operation is optimized.

In step S21, feeder management device 7 identifies that current component type P4 is supplied from third slot SL3 different in the third spot in the production order, and advances the process flow to re-installation guide step S24. In re-installation guide step S24, re-installation guide section 76 performs guidance for removing feeder F4 with holding the reel, and re-installing it later on guide display section 77. As a result, as shown in FIG. 6, at the position of fourth slot SL4 of guide display section 77, the guide content "Remove feeder F4 with holding reel and re-install reel in third slot SL3 in third spot in production order" is displayed. Further, re-installation guide step S24 includes an information display step and displays the removal information on display section 33 corresponding to fourth slot SL4.

Accordingly, the operator can remove feeder F4 and re-install the feeder in the third spot in the production order without difficulty in setup changing work. When re-installation guide step S24 ends, feeder management device 7 merges the process flow into step S10, focuses on fifth slot SL5 in step S11, and returns the process flow to step S5.

In fifth step S4, feeder management device 7 identifies that current component type P5 of fifth slot SL5 matches with required component type P5 of fifth slot SL5 of the third spot in the production order, and advances the process flow to step S21. In step S21, feeder management device 7 identifies that current component type P5 is supplied from the same fifth slot SL5 in the third spot in the production order, and advances the process flow to step S22. In step S22, feeder management device 7 may identify that fifth slot SL5 in the second spot in the production order is unused and need not be assigned to other required component types, and that feeder F5 may continue to occupy fifth slot SL5. Therefore, feeder management device 7 advances the process flow to current state maintenance guide step S23.

In current state maintenance guide step S23, current state maintenance guide section 75 causes guide display section 77 to display guidance for maintaining the current state of feeder F5. As a result, as shown in FIG. 6, at the position of fifth slot SL5 of guide display section 77, the guide content "Maintain current state of feeder F5" is displayed. Feeder F5 is installed in fifth slot SL5 in the second spot in the production order and is unused, but is used in the third spot in the production order.

When current state maintenance guide step S23 is completed, feeder management device 7 merges the process flow into step S10. Here, since the processing of all slots has been completed, feeder management device 7 ends the process flow.

Next, it is assumed that the production of board K of board type B2 of the second spot in the production order is completed and there is no addition of an order of board K of a new type. At this time, guide display section 77 displays the guide contents shown in FIG. 7. FIG. 7 is a diagram showing another example of guide contents.

When the production order is changed from the second to the third spot, first slot SL1 continues to be in an unused state. Therefore, the guide content "Unused" is displayed at the position of first slot SL1 of guide display section 77. In second slot SL2, the supply of component type P2 from feeder F2 is continued. Therefore, at the position of second slot SL2 of guide display section 77, the guide content "Maintain current state of feeder F2" is displayed.

In third slot SL3, the supply of component type P6 from feeder F6 is finished, and there is no plan to use feeder F6 thereafter. Therefore, at the position of third slot SL3 of guide display section 77, the guide content "Remove reel from feeder F6" is displayed. At this time, an automatic rewind step or a manual rewind step is performed. When reel R is actually removed, the guide contents are changed to "Remove feeder F6". Further, by the information display step, removal information is displayed on display section 33 corresponding to third slot SL3.

In fourth slot SL4, component type P7 is supplied from feeder F7, component type P8 is supplied from feeder F8 in the third spot in the production order, and component type P7 is supplied from feeder F7 again in the fourth spot in the production order. That is, component type P7 of feeder F7 needs to temporarily assign fourth slot SL4 to another required component type. Therefore, at the position of fourth slot SL4 of guide display section 77, the guide content "Remove feeder F7 with holding reel, and re-install reel in fourth slot SL4 in fourth spot of production order" is displayed. Further, by the information display step, the removal information is displayed on display section 33 corresponding to fourth slot SL4.

In fifth slot SL5, feeder F5 installed in the unused state is used in the third spot in the production order. Therefore, at the position of fifth slot SL5 of guide display section 77, the guide content "Maintain current state of feeder F5" is displayed.

As described above, even when the production of board K of board type B2 is completed, feeder management device 7 can appropriately guide removal of reel R, removal of feeder 6, maintenance of the current state, and re-installation for each slot position. Further, an automatic rewind step or a manual rewind step is used in guiding removal of reel R, and an information display step is used in guiding removal of feeder 6. Therefore, the operator does not have difficulty in setup changing work and work efficiency is remarkably improved.

4. Aspects and Advantages of Feeder Management Method and Feeder Management Device 7 of Embodiments The feeder management method of the embodiment is a method for managing feeder 6 when board K is produced based on a production plan that specifies a production order of board K of multiple types B1 to B4 in a predetermined future period using: board conveyance device 2 for carrying in/out and positioning board K, component supply device 3 in which multiple feeders 6, for interchangeably holding reels R onto which carrier tape T for holding electronic components is wound, are detachably mounted at multiple installation positions (i.e., slot positions), and electronic component mounter 1 including component transfer device 4 for collecting an electronic component from feeder 6 and mounting the electronic component on board K having a predetermined position; wherein the feeder management method comprises: current state memory step S1 for linking and storing current state component types P1 to P5 of an electronic component to be supplied by currently mounted feeders 6 and the installation positions of mounted feeders 6, plan memory step S2 for storing required component types P2 to P8 of electronic components mounted on board K of multiple types B2 to B4 in association with an installation position of feeder 6 for supplying required component types P2 to P8 of electronic components; and reel removal guide step S5 for guiding removal of reel R from feeder F1 for supplying electronic components of current component type P1 that does not match any of required component types P2 to P8.

With this, it is possible to automatically determine current component type P1, which is not scheduled to be used, by storing and comparing current component types P1 to P5 of the electronic component suppliable in the current state, and required component types P2 to P8 of the electronic component to be required for the production plan. Then, prior to setup changing work, reel R is guided to be removed from feeder F1 which supplies the electronic components of current component type P1 which is not scheduled to be used. Therefore, the operator can remove reel R from feeder F1 without difficulty. This eliminates the need for complicated labor for checking whether reel R is to be removed by checking whether the electronic component is scheduled to be used, thereby improving work efficiency.

Further, the feeder management method of the embodiment further comprises a code linking step of storing a feeder ID code, identifying feeder 6, and reel ID code Rid, identifying reel R in association with each other when feeder 6 holds reel R, and the reel removal guide step S5 includes an association deletion step of deleting the association between the feeder ID code of feeder F1 and the reel ID code Rid of reel R. According to this, since the management of the association between the feeder and the reel is performed automatically, the labor of the operator is unnecessary, and in addition, the association error caused by the artificial error does not occur.

Further, feeder 6 has tape feeding mechanism (sprocket 63, drive motor 64, feeder control section 65) for feeding and rewinding carrier tape T, and reel removal guide step S5 may include an automatic rewinding step of having the tape feeding mechanism of the feeder F1 rewind carrier tape T to second reel R.

Alternatively, feeder 6 may have a tape unwinding mechanism (sprocket 63, drive motor 64, feeder control 65) for feeding carrier tape T, and rewind switch 662 for causing the tape feeding mechanism to rewind a small amount of the carrier tape to the reel, and the reel removal guide step S5 may include a manual feeding step of allowing the tape feeding mechanism to continuously rewind carrier tape T to reel R when rewind switch 662 of feeder F1 is pressed for a long time.

By including the automatic rewind step or the manual rewind step, the labor of rewinding carrier tape T is reduced, thereby improving work efficiency of the operation of removing reel R.

Further, the feeder management method of the embodiment further includes feeder removal guide step S8 for performing a guide for removing feeder F1 from component supply device 3. With this, the operator can remove feeder F1 without difficulty, and work efficiency is improved.

Further, component supply device 3 has display section 33 corresponding to multiple installation positions (i.e., slot positions), and feeder removal guide step S8 includes an information display step of displaying removal information on display section 33 corresponding to the installation position where feeder F1 is installed, and deleting the removal information when the feeder F1 is detached from the installation position. With this, since feeder 6 to be removed is clarified by the removal information, the work efficiency is improved and the operator does not mistake feeder 6 to be removed.

Further, the feeder management method of the embodiment is a method for managing feeder 6 when producing board K based on a production plan defining a production order of multiple types B1 to B4 of board K in a predetermined future period by using: board conveyance device 2 for carrying in/out and positioning board K, component supply device 3 in which multiple feeders 6, for interchangeably holding reel R on which carrier tape T for holding electronic components is wound, are detachably mounted at multiple installation positions (i.e., slot positions), and electronic component mounter 1 provided with component transfer device 4 for collecting the electronic component from feeder 6 and mounting the electronic component on board K having a predetermined position; wherein the feeder management method comprises: current state memory step S1 for linking and storing current component types P1 to P5 of the electronic components supplied by feeders 6 mounted in the current state and the installation positions of mounted feeders 6, plan memory step S2 for linking and storing required component types P2 to P8 of the electronic component to be mounted on multiple types B2 to B4 of board K and installation positions of the feeders for supplying the required component types P2 to P8, current state maintenance guide step S23 for guiding the maintaining of the current state of the first feeders F2, F5 when there is a current component type P2, P5 corresponding to a required component type P2, P5 and removal of feeder F2, F5 provided in the second and fifth slots SL2, SL5 corresponding to the current state component types P2, P5 is unnecessary, and re-installation guide step 24 for guiding the removal of feeders F3, F4 in a state where reel R is held and re-installing feeders F3, F4 later when there are current state component types P3, P4 matching with required component types P3, P4 and removal of feeders F3, F4 that supply current state component types P3, P4 is necessary.

This makes it possible to automatically determine current component types P2 to P5 to be used and automatically determine whether it is necessary to remove feeders F2 to F5 provided in the second to fifth slots SL2 to SL5 corresponding to current component types P2 to P5 to be used. Then, guidance for maintaining the current state of feeders F2, F5, and guidance for detaching feeders F3, F4 with reel R held and reinstalling feeders F3, F4 later are performed. Therefore, the operator can properly handle feeders F2 to F5 without difficulty, and reel R is not erroneously removed from feeders F2 to F5. This eliminates the need to investigate the production plan and evaluate the contents of handling work of feeder 6, thereby improving the work efficiency.

Further, in the feeder management method according to the embodiment, re-installation guidance step S24 is performed, when the third slot SL3 of the third production order, corresponding to required component type P4, does not overlap with the fourth slot SL4 of the first production order, and in spite of the third slot SL3 of the fourth production order, corresponding to required component type P3, overlapping with the third slot SL3 of the first production order, this is also performed when it is necessary to assign the third slot SL3 once to feeders F6 and F4, which supply the electronic components of other required component types P6 and P4, in the course of the production plan. With this, proper handling operation is guided according to various usage forms of feeder 6.

Further, feeder management device 7 of the embodiment is a device for managing feeder 6 when board K is produced based on a production plan defining a production order for multiple types B1 to B4 of boards in a predetermined future period by using: board conveyance device 3 for carrying in/out and positioning board K, component supply device 3 in which multiple feeders, for interchangeably holding reels R on which carrier tape T for holding electronic components is wound, are detachably mounted at multiple installation positions (i.e., slot positions), and electronic component mounter 1 including component transfer device 4 for collecting electronic components from feeder 6 and mounting the electronic components on board K having a predetermined position; wherein the feeder management device comprises: current state memory section 71 for linking and storing current state component types P1 to P5 of the electronic component to be supplied by each currently mounted feeder 6 and the installation positions thereof, plan memory section 72 for linking and storing required component types P2 to P8 of electronic components to be mounted on multiple types B2 to B4 of board K and the installation positions of feeders 6 for supplying the required component types P2 to P8, and reel removal guide section 73 for guiding the removal of reel R from feeder F1 that supplies the electronic component of current component type P1 that does not match any of required component types P2 to P8.

With this, similarly to the feeder management method of the embodiment including reel removal guide step S5, the labor for determining whether to detach reel R is unnecessary, and the work efficiency is improved.

Furthermore, a feeder management device 7 of the embodiment is a device for managing feeder 6 when producing board K based on a production plan defining a production order for multiple types B1 to B4 of boards in a predetermined future period by using: board conveyance device 2 for carrying in/out and positioning board K, component supply device 3 in which multiple feeders 6, for interchangeably holding reels R on which carrier tape T for holding an electronic component is wound, are detachably mounted at multiple installation positions (i.e., slot positions), and electronic component mounter 1 including component transfer device 4 for collecting an electronic component from feeder 6 and mounting the electronic component on board K having a predetermined position; wherein the feeder management device comprises: current state memory section 71 for linking and storing current state component types P1 to P5 of the electronic component to be supplied by each currently mounted feeder 6 and the installation positions thereof, plan memory section 72 for linking and storing required component types P2 to P8 of electronic components to be mounted on multiple types B2 to B4 of board K and the installation positions of feeders 6 for supplying the required component types P2 to P8, current state maintaining guide section 75 for guiding the maintenance of the current state of feeders F2, F5 when there are current component types P2, P5 corresponding to required component types P2, P5 and removal of feeders F2, F5 provided in the second and fifth slots SL2, SL5 corresponding to current state component types P2, P5 is unnecessary, and re-installation guide section 76 for guiding the removal of feeders F3, F4 in a state where reel R is held and re-installing feeders F3, F4 later when there are current state component types P3, P4 matching with required component types P3, P4 and removal of feeders F3, F4 that supply current state component types P3, P4 is necessary.

With this, similarly to the feeder management method of the embodiment including current state maintenance guide step S23 and re-installation guide step S24, it is not necessary to evaluate the contents of an operation of handling a feeder and operation efficiency is improved.

5. Applications and Variations of Embodiments

In embodiments, the configuration of feeder 6 can be changed accordingly. For example, a rewinding mechanism for driving reel R in a reverse direction may be added in the vicinity of reel holding shaft 61 so as to automatically rewind the leading end of carrier tape T to reel R. Further, for example, instead of tape detection sensor 68, a reel detection sensor that directly detects the presence or absence of a reel may be provided in the vicinity of reel holding shaft 61. Further, in link deletion step S7, not only deletion of the link of the ID code, but also deletion of the constraints associated with the link between the feeder ID code and reel ID code Rid may be performed. The constraints include, for example, constraints on usable board production lines, constraints on the types of boards that can be used, and the like. Feeder management device 7 can also be configured using a computer device other than a host computer. Various other applications and modifications of the present disclosure are possible.

REFERENCE SIGNS LIST

1: Electronic component mounter 2: Board conveyance device; 3: Component supply device; 32: Slot 33: Display section 4: Component transfer device 6: Feeder 63: Sprocket 64: Drive motor 65: Feeder control section 662: Rewind switch (manual switch) 7: Feeder management device 71: Current state memory section 72: Plan memory section 73: Reel removal guide section 74: Feeder removal guide section 75: Current state maintenance guide section 76: Re-installation guide section 77: Guide display section K: Board R: Reel T: Carrier tape SL1 to SL5: first to fifth slots (i.e., installation positions).

The invention claimed is:

1. A feeder management method configured to manage a feeder when producing a board based on a production plan specifying a production order of multiple types of boards in a predetermined future period by using:
   a board conveyance device configured to carry in/out and determine a position of a board;
   a component supply device in which multiple feeders are detachably mounted at multiple installation positions, the feeder interchangeably holding a reel onto which a carrier tape with holding electronic components is wound, and
   an electronic component mounter including a component transfer device configured to pick up the electronic components from the feeder and mounting the electronic components on a board having a predetermined position, the feeder management method comprises:
   a current state memory step of linking and storing a current component type of the electronic components, being supplied by the currently mounted feeder, and an installation position of the mounted feeder;
   a plan memory step of linking and storing required component types of the electronic components, being mounted on the multiple types of boards, and an installation position of the feeder of supplying the required components;
   a reel removal guide step of guiding to remove a first reel from a first feeder of supplying the electronic components of which current state component type does not match any of the required component types;
   a code linking step of linking and storing a feeder ID code, identifying the feeder, and the reel ID code, identifying the reel, when the feeder holds the reel, and
   the reel removal guide step includes a link deletion step of deleting the link between the feeder ID code of the first feeder and the reel ID code of the first reel.

2. The feeder management method of claim 1, further comprising a feeder removal guide step of performing guidance in removing the first feeder from a component supply device.

3. The feeder management method of claim 2, wherein
   the component supply device has a display section corresponding to each of the multiple installation positions, and
   the feeder removal guide step includes an information display step of displaying removal information on a display section corresponding to an installation position where the first feeder is installed, and deleting the removal information when the first feeder is removed from the installation position.

4. A feeder management method configured to manage a feeder when producing a board based on a production plan specifying a production order of multiple types of boards in a predetermined future period by using:
   a board conveyance device configured to carry in/out and determine a position of a board;
   a component supply device in which multiple feeders are detachably mounted at multiple installation positions, the feeder interchangeably holding a reel onto which a carrier tape with holding electronic components is wound, and an electronic component mounter including a component transfer device configured to pick up the electronic components from the feeder and mounting the electronic components on a board having a predetermined position, the feeder management method comprises:

a current state memory step of linking and storing a current component type of the electronic components, being supplied by the currently mounted feeder, and an installation position of the mounted feeder;

a plan memory step of linking and storing required component types of the electronic components, being mounted on the multiple types of boards, and an installation position of the feeder of supplying the required components; and a reel removal guide step of guiding to remove a first reel from a first feeder of supplying the electronic components of which current state component type does not match any of the required component types, wherein the feeder includes a tape feeding mechanism for feeding and rewinding the carrier tape, and the reel removal guide step includes an automatic rewinding step of rewinding the carrier tape onto the first reel with the tape feeding mechanism of the first feeder.

5. The feeder management method of claim 4, wherein
the feeder includes a manual switch for causing the tape feeding mechanism to rewind a small amount of the carrier tape onto the reel, and the reel removal guide step includes a manual rewinding step of allowing the tape feeding mechanism to continuously rewind the carrier tape onto the first reel when the manual switch of the first feeder is pressed for a predetermined time.

6. A feeder management method configured to manage a feeder when producing a board based on a production plan specifying a production order of multiple types of boards in a predetermined future period by using:

a board conveyance device configured to carry in/out and determine a position of a board;

a component supply device in which multiple feeders are detachably mounted at multiple installation positions, the feeder interchangeably holding a reel onto which a carrier tape with holding electronic components is wound, and an electronic component mounter including a component transfer device configured to pick up the electronic components from the feeder and mounting the electronic components on a board having an installation position, the feeder management method comprises:

a current state memory step of linking and storing a current component type of the electronic components, being supplied by the currently mounted feeder, and an installation position of the mounted feeder;

a plan memory step of linking and storing required component types of the electronic components, being mounted on the multiple types of boards, and an installation position of the feeder of supplying the required components;

a current state maintenance guide step of guiding maintenance of the current state of a first feeder when there is the current component type corresponding to the required component type and removal of the first feeder is unnecessary; and a re-installation guide step of guiding removal of a first feeder in a state where a reel is held, and guiding re-installation when there is the current component type corresponding to the required component type and removal of the first feeder is necessary, wherein the re-installation guide step is performed when an installation position corresponding to the required component type does not overlap a first installation position, and even in a case where an installation position corresponding to the required component type overlaps with the first installation position, the re-installation guide step is performed when temporarily assignment is required for assigning the first installation position to a second feeder supplying other required component type electronic components in a course of the production plan.

7. A feeder management device configured to manage a feeder when producing a board based on a production plan specifying a production order of multiple types of boards in a predetermined future period by using:

a board conveyance device configured to carry in/out and determine a position of a board;

a component supply device in which multiple feeders are detachably mounted at multiple installation positions, the feeder interchangeably holding a reel onto which a carrier tape with holding electronic components is wound;

an electronic component mounter including a component transfer device configured to pick up the electronic components from the feeder and mounting the electronic components on a board having a predetermined position;

a current state memory section configured to link and store a current component type of the electronic components, being supplied by the currently mounted feeder, and an installation position of the mounted feeder;

a plan memory section configured to link and store a required component type of the electronic components, being mounted on the multiple types of boards, and an installation position of the feeder of supplying the required components; and a reel removal guide section configured to guide removal of a first reel from a first feeder of supplying the electronic components of which current state component type does not match any of the required component types, wherein the feeder includes a tape feeding mechanism for feeding and rewinding the carrier tape, and the removal of the first real includes an automatic rewinding of the carrier tape onto the first reel with the tape feeding mechanism of the first feeder.

8. A feeder management device configured to manage a feeder when producing a board based on a production plan specifying a production order of multiple types of boards in a predetermined future period by using:

a board conveyance device configured to carry in/out and determine a position of a board;

a component supply device in which multiple feeders are detachably mounted at multiple installation positions, the feeder interchangeably holding a reel onto which a carrier tape with holding electronic components is wound;

an electronic component mounter including a component transfer device configured to pick up the electronic components from the feeder and mounting the electronic components on a board having a predetermined position;

a current state memory section configured to link and store a current component type of the electronic components, being supplied by the currently mounted feeder, and an installation position of the mounted feeder;

a plan memory section configured to link and store a required component type of the electronic components, being mounted on the multiple types of boards, and an installation position of the feeder of supplying the required components;

a current state maintenance guide section configured to guide maintenance of the current state of a first feeder when there is the current component type corresponding to the required component type and removal of the first feeder is unnecessary; and a re-installation guide section configured to guide removal of a first feeder in a state where a reel is held and guiding re-installation when there is the current component type corresponding to the required component type and removal of the first feeder is necessary, wherein the re-installation guide section is configured to guide the removal of the first feeder when an installation position corresponding to the required component type does not overlap a first installation position, and even in a case where an installation position corresponding to the required component type overlaps with the first installation position, the removal of the first feeder is performed when temporarily assignment is required for assigning the first installation position to a second feeder supplying other required component type electronic components in a course of the production plan.

* * * * *